(12) United States Patent
Kakuno

(10) Patent No.: US 10,454,259 B2
(45) Date of Patent: Oct. 22, 2019

(54) CIRCUIT ASSEMBLY AND ELECTRICAL JUNCTION BOX

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventor: Yutaka Kakuno, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

(*) Notice: Subject to any disclaimer, the term of this patent is extended or adjusted under 35 U.S.C. 154(b) by 0 days.

(21) Appl. No.: 15/544,538

(22) PCT Filed: Jan. 7, 2016

(86) PCT No.: PCT/JP2016/050294
§ 371 (c)(1),
(2) Date: Jul. 19, 2017

(87) PCT Pub. No.: WO2016/117361
PCT Pub. Date: Jul. 28, 2016

(65) Prior Publication Data
US 2018/0269670 A1 Sep. 20, 2018

(30) Foreign Application Priority Data

Jan. 21, 2015 (JP) .................. 2015-009177

(51) Int. Cl.
*H02G 3/16* (2006.01)
*G01R 1/20* (2006.01)
(Continued)

(52) U.S. Cl.
CPC .............. *H02G 3/16* (2013.01); *G01R 1/203* (2013.01); *G01R 15/14* (2013.01); *G01R 19/0092* (2013.01); *G01R 31/006* (2013.01)

(58) Field of Classification Search
CPC ............... G01R 1/203; G01R 19/0092; B60R 16/0239; H02G 3/16
(Continued)

(56) References Cited

U.S. PATENT DOCUMENTS 4,841,235 A * 6/1989 Hastings .............. G01R 15/205
324/117 R
5,831,425 A * 11/1998 Ochiai ................... G01R 1/203
324/117 R
(Continued)

FOREIGN PATENT DOCUMENTS

JP H09-093771 A 4/1997
JP 2004-294306 A 10/2004
JP 2004-340917 A 12/2004

OTHER PUBLICATIONS

Search Report for PCT/JP/2016/050294, dated Apr. 12, 2016.

*Primary Examiner* — Patrick Assouad
*Assistant Examiner* — Demetrius R Pretlow
(74) *Attorney, Agent, or Firm* — Honigman LLP

(57) ABSTRACT

A circuit assembly includes a circuit board having a conductive path, and an electric current sensor for detecting an electric current shunted from the conductive path, the electric current sensor being connected in parallel to a section of the conductive path that is not connected to any element having a resistance.

8 Claims, 16 Drawing Sheets

(51) Int. Cl.
*G01R 15/14* (2006.01)
*G01R 19/00* (2006.01)
*G01R 31/00* (2006.01)

(58) Field of Classification Search
USPC .................................................. 324/76.11
See application file for complete search history.

(56) References Cited

U.S. PATENT DOCUMENTS

| | | | | |
|---|---|---|---|---|
| 6,545,456 | B1* | 4/2003 | Radosevich | G01R 15/202 |
| | | | | 324/117 H |
| 6,683,448 | B1* | 1/2004 | Ohtsuka | H01L 43/065 |
| | | | | 257/E43.003 |
| 2007/0159159 | A1* | 7/2007 | Okada | G01R 15/205 |
| | | | | 324/117 H |
| 2008/0042636 | A1* | 2/2008 | Koste | G01R 15/205 |
| | | | | 324/96 |
| 2011/0298454 | A1* | 12/2011 | Ausserlechner | G01R 15/207 |
| | | | | 324/252 |
| 2012/0091995 | A1* | 4/2012 | Iwamoto | G01R 33/07 |
| | | | | 324/117 H |
| 2013/0106449 | A1* | 5/2013 | Kikuchi | H01M 10/48 |
| | | | | 324/713 |
| 2016/0141214 | A1* | 5/2016 | Sato | H01L 23/49811 |
| | | | | 257/77 |
| 2017/0192039 | A1* | 7/2017 | Desurvire | G01R 33/035 |

* cited by examiner

CIRCUIT ASSEMBLY AND ELECTRICAL JUNCTION BOX

CROSS-REFERENCE TO RELATED APPLICATIONS

This application is the U.S. national stage of PCT/JP2016/050294 filed Jan. 7, 2016, which claims priority of Japanese Patent Application No. JP 2015-009177 filed Jan. 21, 2015.

TECHNICAL FIELD

The present invention relates to a circuit assembly and an electrical junction box.

BACKGROUND

Conventionally known is a technique for detecting an electric current through a conductive path with an electric current sensor. As this type of electric current sensor, an electric current sensor provided with a Hall element needs to be used in accordance with the magnitude of an electric current, and thus if the electric current is too large, a large electric current sensor needs to be used, which does not meet the demand for a decrease in its size and is problematic in that its manufacturing cost will increase. In view of this, a technique is known in which a conductive path is provided with a parallel circuitry, an electric current is shunted, connecting resistance elements to this parallel circuitry, and the shunt current is detected. In JP 2004-294306A, a conductive line for connecting a driver and a motor branches to a main conductive line and a bypass line, a shunt resistor is connected to the main conductive line, and a voltage division resistor and a non-contact electric current sensor are connected in series to the bypass line. Doing so makes electric current flow through the lines based on the ratio of the shunt resistor, the voltage division resistor, and the internal input resistance of the non-contact electric current sensor, and thus it is possible to reduce the size of the electric current sensor compared to the case in which the overall flowing current is detected with the electric current sensor.

Incidentally, with the configuration of JP 2004-294306A, in order to detect the electric current, the shunt resistor and the voltage division resistor are connected to a parallel circuitry, and thus power loss occurs due to the electric current flowing through these resistors, which is problematic in that the advantage that the non-contact electric current sensor does not lose power significantly was not obtained sufficiently.

The present invention was made based on the above-described circumstances, and an object of the present invention is to reduce loss caused by resistors and detect the electric current of a conductive path.

SUMMARY

A circuit assembly of the present invention includes a circuit board having a conductive path and an electric current sensor for detecting an electric current shunted from the conductive path, the electric current sensor being connected in parallel to a section of the conductive path that is not connected to any element having a resistance.

According to this configuration, in the section of the conductive path that is not connected to any element having a resistance, a shunt current shunted at the inverse ratio of an internal resistance of the section to a resistance (internal resistance) of a parallel circuitry that is connected in parallel to the section flows through the parallel circuitry. If this shunt current is detected by the electric current sensor, the electric current of the conductive path can be detected based on this shunt current and the ratio. Thus, the section of the conductive path that is not connected to any element having a resistance is not conductively connected to the element having a resistance when the electric current is detected, and thus it is possible to reduce loss caused by the resistor and detect the electric current of the conductive path.

An embodiment of the present invention preferably has the following aspects.

A material of a shunt path through which the shunt current flows has the same temperature properties as a material of the section of the conductive path that is not connected to any element having a resistance.

According to this configuration, a material of the shunt path has the same temperature properties as a material of the section that is not connected to any element having a resistance, and thus even if the shunt path is affected by heat from the outside, the electric current can be detected precisely.

The circuit board includes an insulating board obtained by forming the conductive path made of metal foil on an insulating plate, and a bus bar that serves as the conductive path placed on the insulating board, and the section that is not connected to any element having a resistance is disposed in the path of the bus bar.

Accordingly, an electric current shunted from the bus bar is detected by the electric current sensor, and thus a relatively large electric current can be detected with an electric current sensor having a small capacity.

The insulating board and the bus bar are stacked on each other.

The electric current sensor includes a plurality of power terminals that are connected in parallel to the section that is not connected to any element having a resistance and an output terminal for outputting a signal indicating a detection result of detecting an electric current, and the output terminal is connected to the conductive path of the insulating board.

Accordingly, the signal indicating the detection result of detecting a small flowing current can be transmitted to the conductive path of the insulating board.

The plurality of power terminals are connected to the bus bar, and the section that is not connected to any element having a resistance is located between the plurality of power terminals.

Accordingly, the electric current of the bus bar can be detected simply by connecting the plurality of power terminals to the bus bar.

In the bus bar, a plurality of electric current paths are formed in the section that is not connected to any element having a resistance, and the electric current sensor is connected to the electric current paths.

Accordingly, it is possible to shunt the electric current of the bus bar with a simple configuration in which the plurality of electric current paths are formed in the bus bar.

The section of the conductive path that is not connected to any element having a resistance is formed to detour.

Accordingly, if there is a risk that the accuracy of the electric current detection decreases due to a resistance value of the parallel circuitry being significantly larger than an internal resistance of the conductive path, the internal resistance of the section that is not connected to any element having a resistance can be increased, and thus it is possible to suppress a decrease in the accuracy of the electric current detection.

An electrical junction box includes the circuit assembly and a case for accommodating the circuit assembly.

Advantageous Effects of Invention

According to the present invention, it is possible to reduce loss caused by a resistor and to detect the electric current of a conductive path.

DETAILED DESCRIPTION OF PREFERRED EMBODIMENTS

Embodiment 1

Embodiment 1 will be described with reference to FIGS. 1 to 6.

An electrical junction box 10 is disposed in a path extending from a power source such as a battery to a load such as a motor in a vehicle (not shown) such as an electric car or a hybrid car, for example, and is provided in an engine room that is easily affected by heat.

Electrical Junction Box 10

Figure 1:
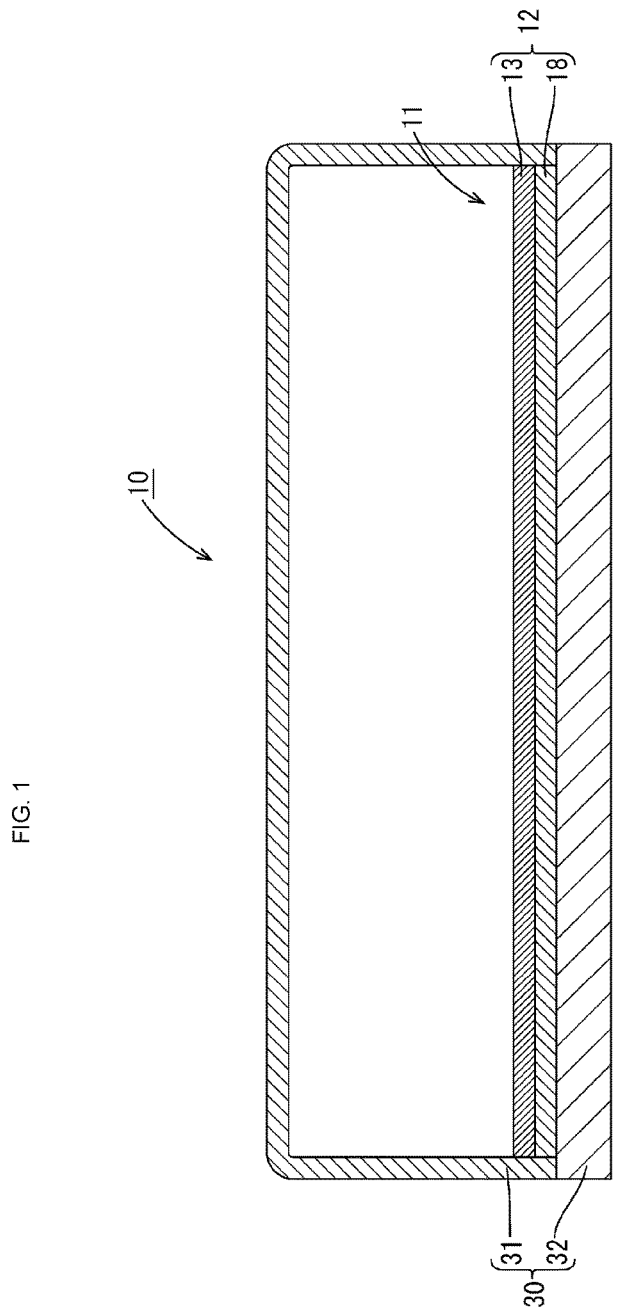
FIG. 1 shows a longitudinal cross-sectional view of an electrical junction box of Embodiment 1.

As shown in FIG. 1, the electrical junction box 10 includes a circuit assembly 11 and a case 30 for accommodating the circuit assembly 11. The case 30 includes a box-shaped case main body 31 made of metal, and a heat dissipation member 32 placed on a circuit board 12. The heat dissipation member 32 is made of a metal material with a high heat conductivity, and is placed on the circuit board 12 via an insulating adhesive.

Circuit Assembly 11

Figure 2:
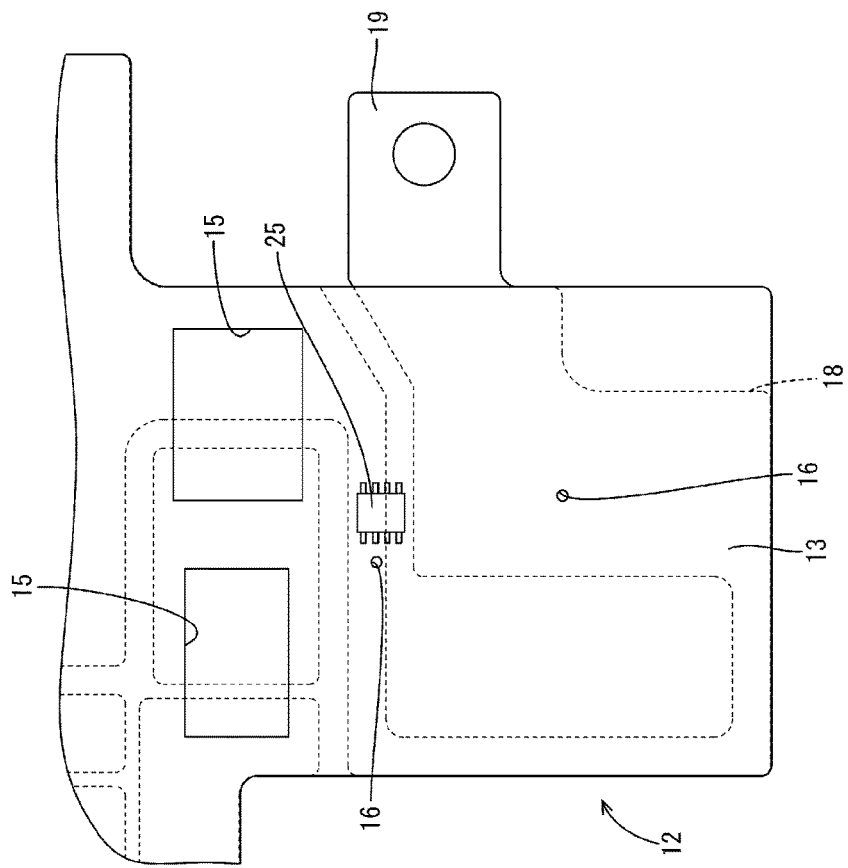
FIG. 2 shows a plan view of a portion of a circuit board.
Figure 3:
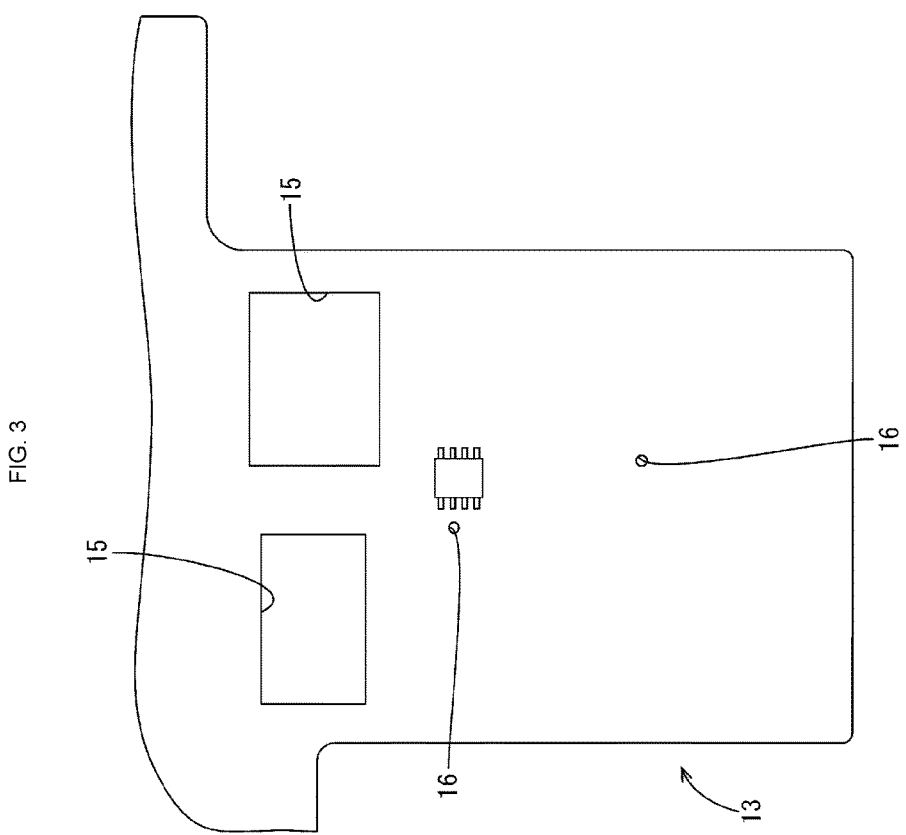
FIG. 3 shows a plan view of a portion of an insulating board.
Figure 4:
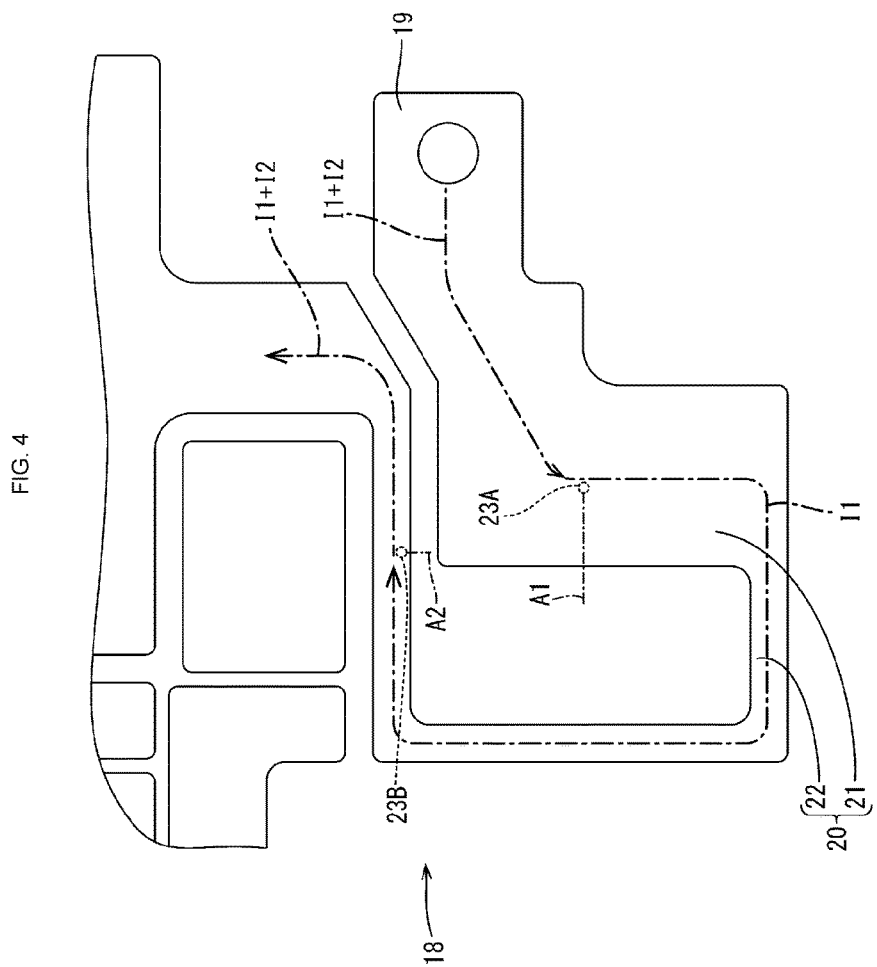
FIG. 4 shows a plan view of a portion of a bus bar.

As shown in FIGS. 2 to 4, the circuit assembly 11 includes the circuit board 12 and a plurality of electronic components mounted on the circuit board 12, such as an electric current sensor 25 (components other than the electric current sensor 25 are omitted in the drawings). Note that in FIGS. 2 to 4, one corner portion of the entire surface of the rectangular circuit board 12 is depicted and the other portions are omitted.

Circuit Board 12

The circuit board 12 includes an insulating board 13 obtained by forming a conductive path (not shown) made of metal such as copper foil on a surface of an insulating plate, through printed wiring, and a bus bar 18 made of a plate-shaped metal having a shape corresponding to the shape of the conductive path. The insulating board 13 is provided with a terminal insertion hole 14, component mounting holes 15, and via holes 16A and 16B. The component mounting hole 15 has a rectangular shape corresponding to the shape of an electronic component (an FET (field effect transistor), an IC (integrated circuit), a resistor, a capacitor, or the like) that is to be mounted, and terminals of the electronic component can be connected to the conductive paths of the insulating board 13 and the bus bar 18. The via holes 16A and 16B have a circular shape and conductive inner walls, and are formed at positions that communicate with the conductive path of the insulating board 13. The via holes 16A and 16B and the bus bar 18 located directly below the via holes 16A and 16B are electrically connected to each other by applying solder to the via holes 16A and 16B, for example.

The bus bar 18 is made of metal such as copper or a copper alloy, and is formed by stamping out the conductive path from a plate-shaped metal with a metal mold. The bus bar 18 includes a terminal portion 19 that is connectable to an external terminal (not shown). As shown in FIG. 4, the terminal portion 19 leads to a detour conductive path 20 extending to a load L side (or the power source side) through a detour path.

If an internal resistance RA of the detour conductive path 20 is too small compared to an internal resistance RC of the electric current sensor 25, which will be described later, then the detection accuracy cannot be maintained. Thus, the resistance of the conductive path is increased by increasing the length of the conductive path, and the ratio between the internal resistance RA and the internal resistance RC is set to be in such a range that the detection accuracy can be maintained. This detour conductive path 20 includes a wider portion 21 having a larger width and a narrower portion 22 having a smaller width than the wider portion 21 at least in the path located between A1 and A2 in FIG. 4. The shape and size of the wider portion 21 and the narrower portion 22 are set as appropriate based on a detourable path or a required resistance value. The via holes 16A and 16B of the insulating board 13 are located at positions near a start-edge of the wider portion 21 and a position located near an end-edge of the narrower portion 22. These positions serve as a pair of branch points 23A and 23B at which the conductive path branches to a parallel circuitry of the electric current sensor 25.

A path between the pair of branch points 23A and 23B of the bus bar 18 (the path between A1 and A2 in FIG. 4) serves as a section attached to no electronic components such as other resistance elements (not connected to any element having a resistance). That is, the resistance in this section is only the internal resistance of the bus bar 18 in this section. The electronic components include the electric current sensor 25, an FET, an IC, a resistor, a capacitor, and the like (not shown), and these components are mounted on the conductive path of the circuit board 12.

Electric Current Sensor 25

Figure 5:
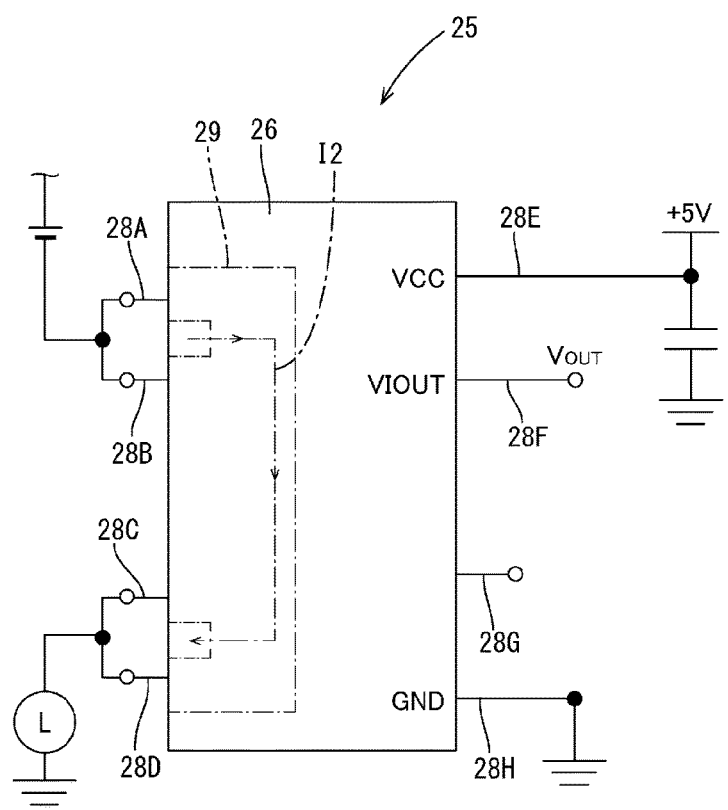
FIG. 5 shows a plan view showing the connection between an electric current sensor and an external portion.

The electric current sensor 25 is a Hall-type electric current sensor (non-contact electric current sensor) using a Hall element, and detects the electric current shunted from a parallel circuitry not connected to any element having a resistance, without coming into contact therewith. As shown in FIG. 5, in the electric current sensor 25, a flat rectangular package 26 accommodates the Hall element, and eight terminals 28A to 28H protrude from the side surface of the package 26. The terminals 28A to 28H are connected to the conductive path on the surface of the insulating board 13 by soldering.

The four left terminals 28A to 28D of the eight terminals 28A to 28H include two power terminals 28A and 28B into which a direct-current power is input from the power source, and two power terminals 28C and 28D for outputting power to the load L. The power terminals 28A and 28B are connected to the power terminals 28C and 28D via a detection conductive path 29 that is provided inside the package 26 and that is made of copper or a copper alloy. The power terminals 28A and 28B are connected to the one via hole 16A via the conductive path of the insulating board 13, and the power terminals 28C and 28D are connected to the other via hole 16B via the conductive path of the insulating board 13. A shunt current I2 flows through the power terminals 28A to 28D and the detection conductive path 29. In the present embodiment, the conductive path of the insulating board 13, which is the shunt path, the power terminals 28A to 28D, and the detection conductive path 29, and the bus bar 18, which serves as the main path, are made of the same material (copper or a copper alloy), and accordingly, the main path and the shunt paths have the same temperature properties.

The four right terminals 28E to 28H include a power source terminal 28E, an output terminal 28F, a filter terminal 28G, and a ground terminal 28H. The power source terminal 28E receives a voltage of 5 V from the power source, for example. The output terminal 28F outputs signals indicating the detection result of detecting the shunt current I2 shunted from the bus bar 18 between the power terminals 28A to 28D. The filter terminal 28G is connected to a capacitor or the like, and reduces noise of an output signal, for example.

Figure 6:
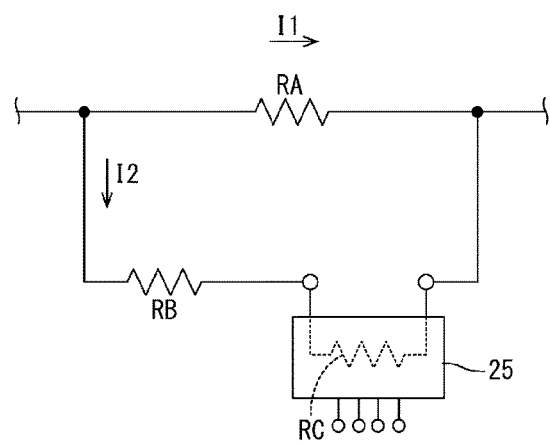
FIG. 6 is a diagram showing an internal resistance of a parallel circuitry.

FIG. 6 shows a relationship between the internal resistance RA of a section (the section not connected to any element having a resistance) located between the branch point 23A and the branch point 23B of the bus bar 18, the internal resistance RB from the branch points 23A and 23B to connection points connected to the power terminals 28A to 28D in the conductive path of the insulating board 13, and the internal resistance RC of the electric current sensor 25. An expression for the relation between electric current I1 of the detour conductive path 20 and the shunt current I2 is I2/I1=RA/(RB+RC), and a flow dividing ratio α is I2/(I1+I2)=RA/(RA+RB+RC). Usage of these equations makes it possible to detect the electric current (I1+I2) of the conductive path with the detection circuit. Although a detection circuit for detecting the overall electric current (I1+I2) of the conductive path based on the shunt current I2 is provided on the circuit board 12, there is no limitation to this, and a Hall IC obtained by providing a detection circuit within the electric current sensor may also be used.

According to the present embodiment, the following functional effects and effects can be obtained.

According to the present embodiment, in the conductive path (bus bar 18), the shunt current I2 shunted at the inverse ratio of the internal resistance RA between the branch points 23A and 23B (the section not connected to any element having a resistance) to the internal resistance (RB+RC) of the parallel circuitry connected in parallel to this section flows through the parallel circuitry. If this shunt current I2 is detected by the electric current sensor 25, the electric current of the conductive path can be detected based on this shunt current I2 and the ratio between the internal resistances. Thus, it is possible to detect the electric current of the conductive path between the branch points 23A and 23B in the conductive path (bus bar 18), without causing ohmic loss resulting from electric current flowing through a resistance element (element having a resistance) when the electric current is detected.

Also, no element having a resistance is connected to the shunt path through which the shunt current I2 flows (between the conductive path of the insulating board 13 and the terminals 28A to 28H of the sensor 25), and the material of the shunt path is a material (copper or a copper alloy) having the same temperature properties as the section (the section not connected to any element having a resistance) of the conductive path (bus bar 18) that is located between the branch points 23A and 23B.

There is a risk that when an element having a resistance is connected to the shunt path, the accuracy of the electric current detection will decrease due to the temperature properties of this element, but according to the present embodiment, no element having a resistance is connected to the shunt path, and thus the accuracy of the electric current detection is not affected by the temperature properties of the element. Moreover, the main path and the shunt path are made of a material (all of the paths are made of copper or a copper alloy) having the same temperature properties (temperature-resistance curve), and thus even in an environment in which its detection is affected by heat from the outside, such as an engine room, an electric current can be detected with high accuracy. Note that the "material having the same temperature properties" may also be a material having a difference to such a degree that the electric current detection is not affected.

Also, the circuit board 12 includes the insulating board 13 obtained by forming the conductive path made of metal foil on an insulating plate, and the bus bar 18 that serves as the conductive path placed on the insulating board 13, and the section (the section not connected to any element having a resistance) located between the branch points 23A and 23B is disposed in the path of the bus bar 18.

Accordingly, the shunt current I2 shunted from the bus bar 18 is detected by the electric current sensor 25, and thus a relatively large electric current can be detected using the electric current sensor 25 having a small capacity.

Also, the electric current sensor 25 includes the plurality of power terminals 28A to 28D that are connected in parallel to the section located between the branch points 23A and 23B (the section not connected to any element having a resistance), and the output terminal 28F for outputting signals indicating the detection result of detecting the electric current, and the output terminal 28F is connected to a conductive path of the insulating board 13.

Accordingly, the signal indicating the detection result, which is a low-current signal, can be transmitted to the conductive path of the insulating board 13.

Also, in the bus bar 18, the detour conductive path 20 detours between the branch points 23A and 23B (the section not connected to any element having a resistance).

Accordingly, if there is a risk that the accuracy of the electric current detection decreases due to the resistance value (RB+RC) of the parallel circuitry being significantly larger than the internal resistance RA of the conductive path, then the internal resistance RA of the bus bar 18 (the section not connected to any element having a resistance) can be increased, making it possible to suppress a decrease in detection accuracy.

Embodiment 2

Embodiment 2 will be described with reference to FIGS. 7 and 8. Although the bus bar 18 is placed on the insulating board 13 in Embodiment 1, a circuit assembly 40 of Embodiment 2 has a configuration in which an insulating board 13 and the bus bar 18 are spaced apart from and flush with each other. Because the other structures are the same as those of Embodiment 1, structures that are the same as those of Embodiment 1 are given the same reference numerals, and their description will be omitted.

Figure 7:
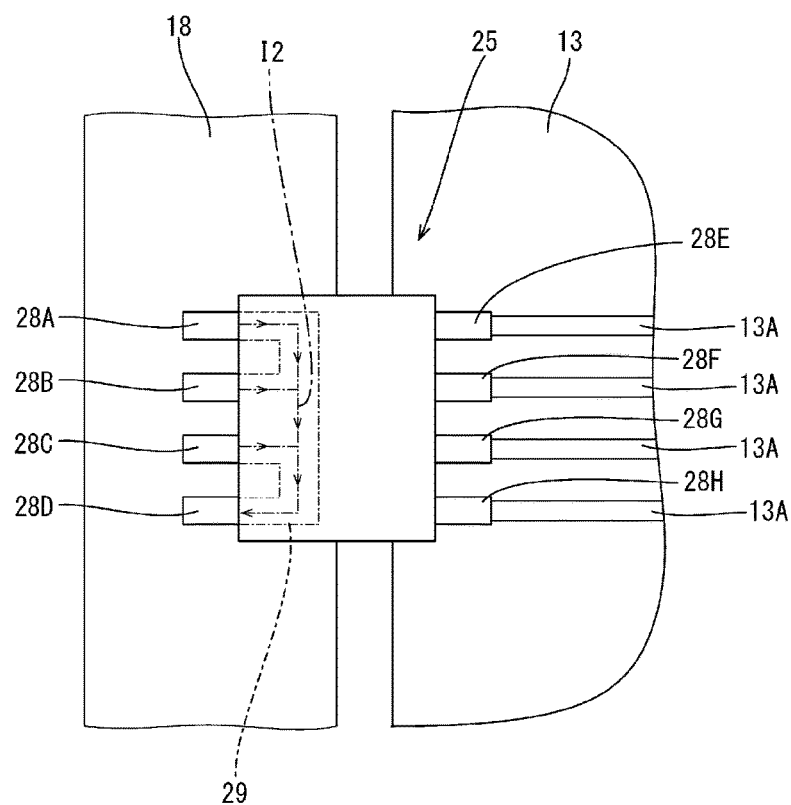
FIG. 7 shows a plan view of an enlarged portion in which an electric current sensor of Embodiment 2 is mounted on a circuit board.
Figure 8:
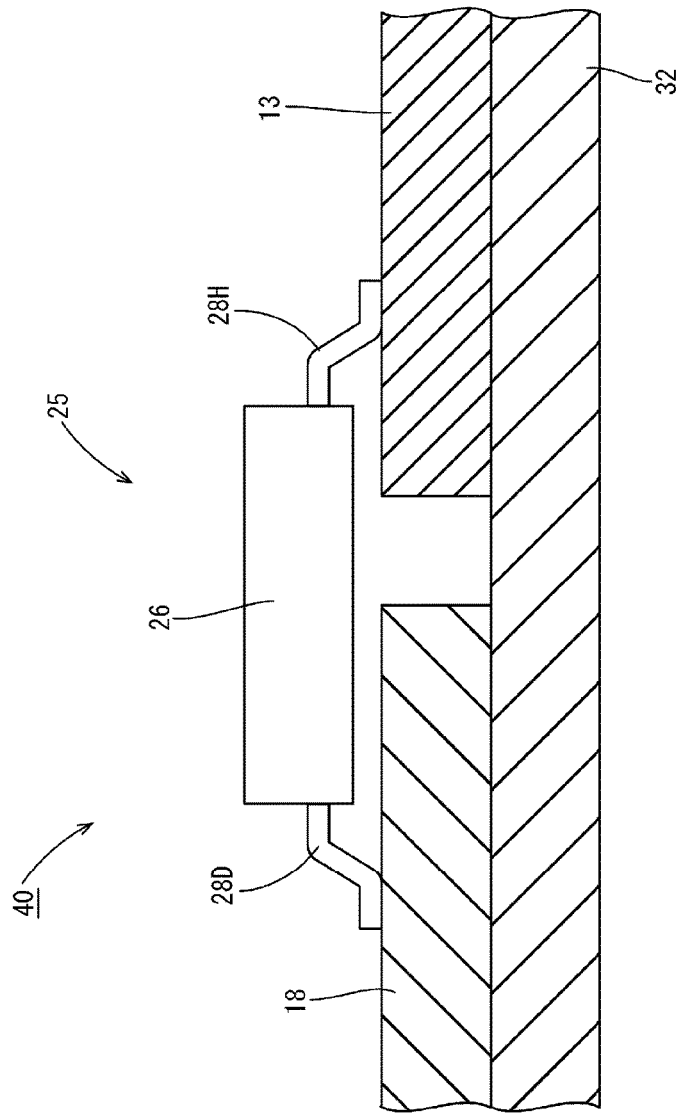
FIG. 8 is a longitudinal cross-sectional view of FIG. 7.

As shown in FIGS. 7 and 8, in the circuit assembly 40, the bus bar 18 and the insulating board 13 are spaced apart from each other (disposed across a gap) on a heat dissipation member 32. Four left terminals 28A to 28D of the electric current sensor 25 are soldered to the bus bar 18, and four right terminals 28E to 28H are soldered to a conductive path 13A on the surface of the insulating board 13.

According to Embodiment 2, the plurality of power terminals 28A to 28D are connected to the bus bar 18, and the sections located between the plurality of power terminals 28A to 28D in the bus bar 18 are the sections not connected to any element having a resistance.

Accordingly, the shunt current I2 derived from the bus bar 18 can be detected simply by connecting the plurality of power terminals 28A to 28D to the bus bar 18.

Embodiment 3

Embodiment 3 will be described with reference to FIG. 9. Structures that are the same as those of the above-described embodiments are given the same reference numerals, and their description will be omitted.

Figure 9:
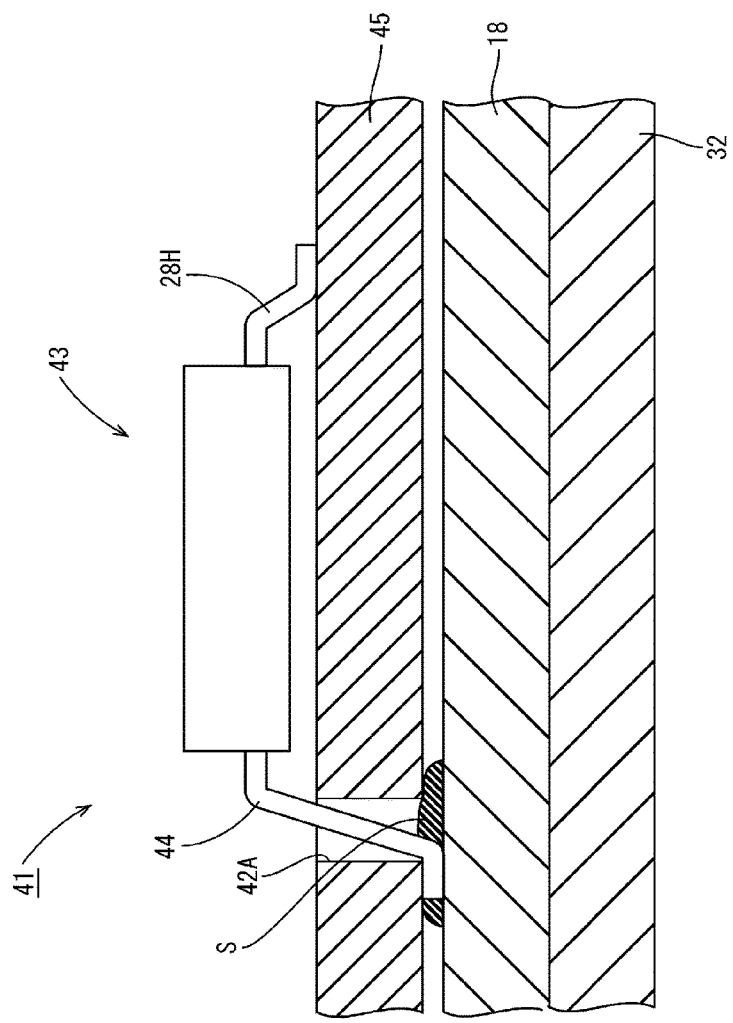
FIG. 9 shows a longitudinal cross-sectional view of an enlarged portion in which an electric current sensor of Embodiment 3 is mounted on a circuit board.

As shown in FIG. 9, in a circuit assembly 41 of Embodiment 3, an insulating board 45 obtained by forming a conductive path made of copper foil on an insulating plate by printed wiring is disposed at a position that overlaps with the bus bar 18 across a gap, and a circular through-hole 42A is formed in the insulating board 45 in the vicinity of an electric current sensor 43. Also, four left power terminals 44 of the electric current sensor 43 are longer than its right terminals 28E to 28H, and pass through the through-hole 42A, and their edges are soldered to the bus bar 18 with a solder S.

Embodiment 4

Embodiment 4 will be described with reference to FIGS. 10 and 11. In a circuit assembly 45 of Embodiment 4, an insulating board 46 and a bus bar 18 that are spaced apart from and flush with each other are connected to each other by wire bonding. Hereinafter, structures that are the same as those of the above-described embodiments are given the same reference numerals, and their description will be omitted.

Figure 10:
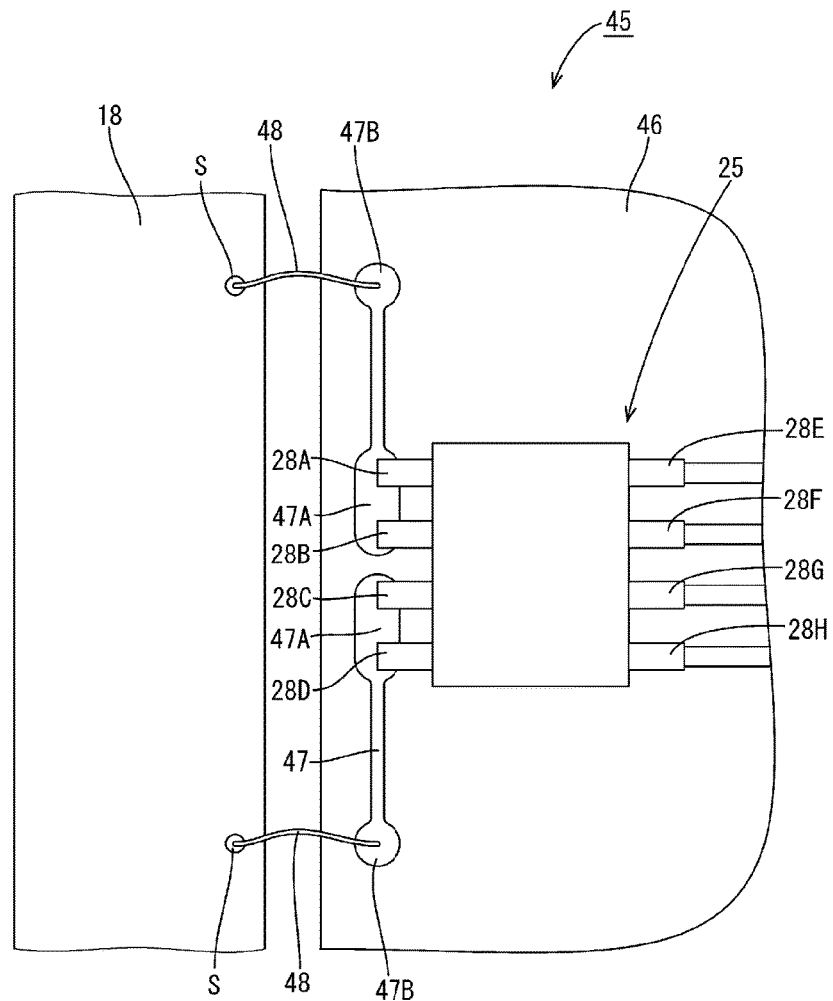
FIG. 10 shows a plan view of the enlarged vicinity of a portion in which an electric current sensor of Embodiment 4 is mounted on a circuit board.
Figure 11:
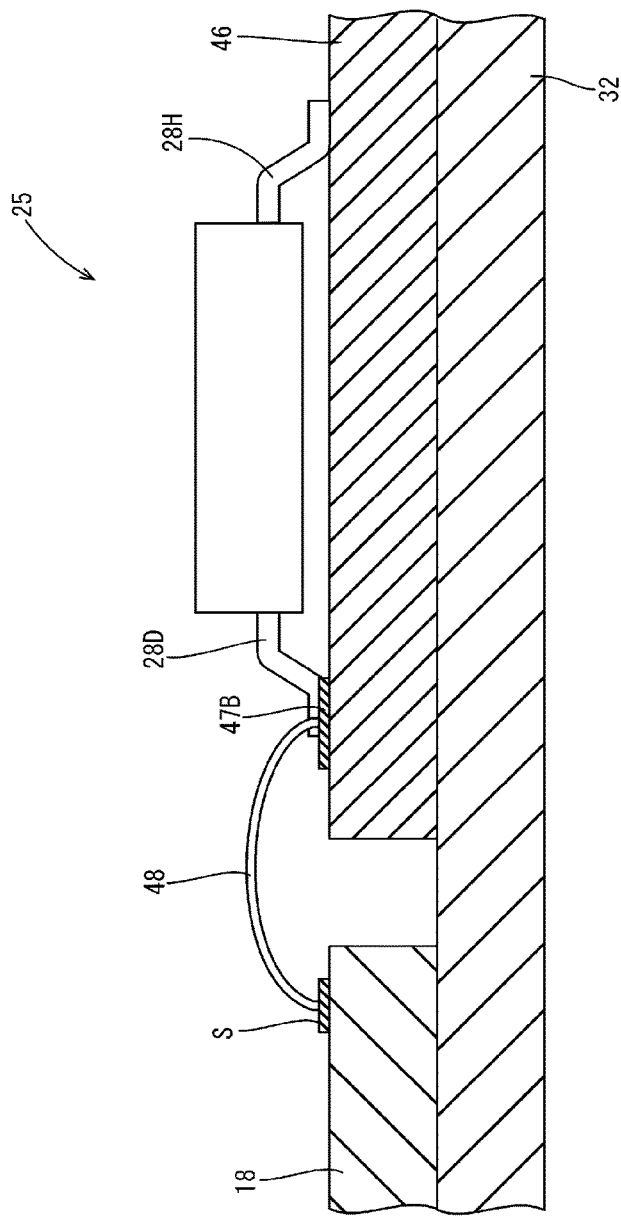
FIG. 11 is a longitudinal sectional view of FIG. 10.

As shown in FIGS. 10 and 11, power terminals 28A to 28H of an electric current sensor 25 are soldered to lands 47A in conductive paths 47 of the insulating board 46. In the conductive paths 47 of the insulating board 46, lands 47B are formed to which bonding wires 48 are to be soldered to their ends extending from the lands 47A along a circumferential edge of the insulating board 46. The bonding wires 48 are made of copper, a copper alloy, aluminum, an aluminum alloy, or the like, for example. One end of the bonding wires 48 is soldered to the bus bar 18 with the solder S, and the other end is soldered to the conductive path 47 of the insulating board 46. Note that the bonding wires may also be connected by melting metal other than solder, and the bonding wire 48 may also be directly connected with heat, ultrasonic waves, or the like, without melting metal.

Embodiment 5

Figure 12:
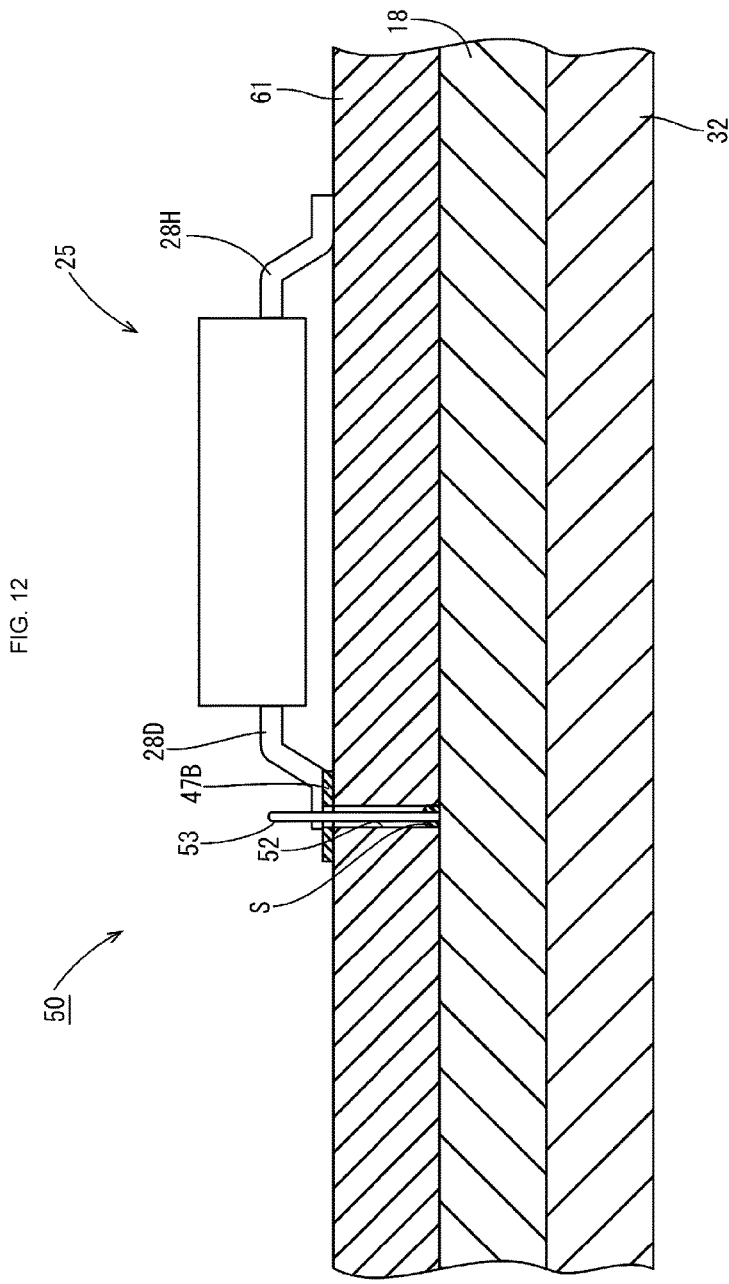
FIG. 12 shows a longitudinal cross-sectional view of an enlarged portion in which an electric current sensor of Embodiment 5 is mounted on a circuit board.

Embodiment 5 will be described with reference to FIG. 12. Different from the circuit assembly of Embodiment 4, in the circuit assembly 50 of Embodiment 5, an insulating board 61 is stacked on the bus bar 18, other ends of a pair of bonding wires 53 soldered to its two lands 47B pass through through-holes 52 that pass through the insulating board 61 and are soldered to the bus bar 18 with a solder S. The other structures are the same as those of Embodiment 4, and thus their description will be omitted.

Embodiment 6

Embodiment 6 will be described with reference to FIGS. 13 to 16.

In Embodiment 6, a plurality of electric current paths 62 and 63 for shunting an electric current are formed by forming a slit 61 in a section B1, of one bus bar 60, that is not connected to any element having a resistance, the slit extending along the conduction direction.

Figure 13:
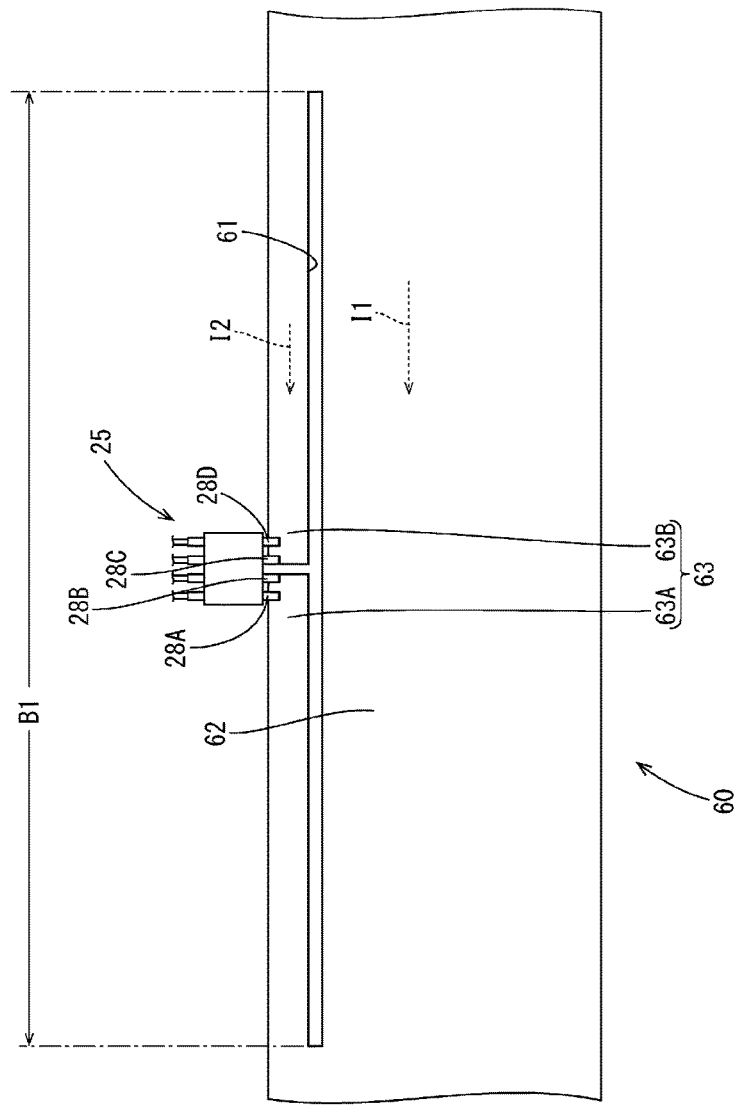
FIG. 13 shows a plan view of a bus bar in which an electric current sensor is mounted on a shunt path of Embodiment 6.

As shown in FIG. 13, the bus bar 60 extending in a belt shape is provided with the slit 61 extending along the conduction direction, and a main path 62 is formed on one side in the width direction of the bus bar 60 that is divided by the slit 61, and a shunt path 63 having a smaller width than the main path 62 is formed on the other side in the width direction.

The shunt path 63 includes shunt paths 63A and 63B that are divided in their middle portion, and the electric current of the shunt path 63A flows through the shunt path 63B via the electric current sensor 25 by connecting the plurality of power terminals 28A to 28D of the electric current sensor 25 to the ends of the shunt paths 63A and 63B.

Figure 14:
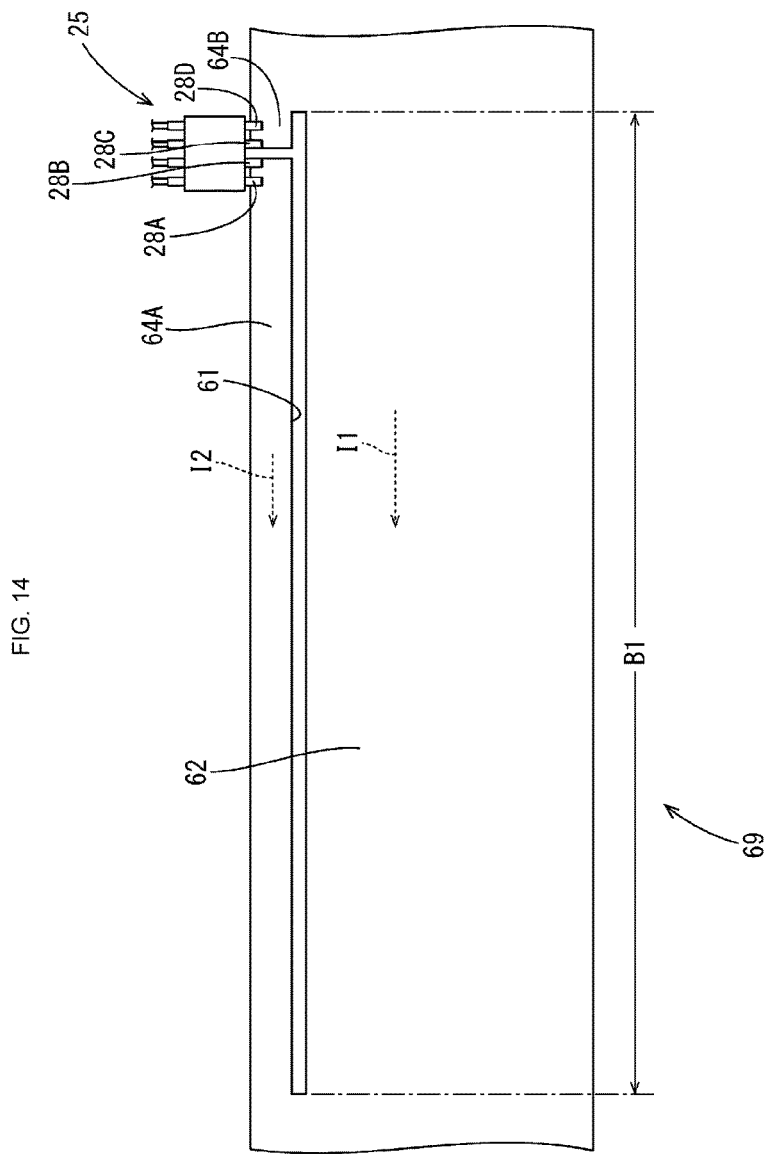
FIG. 14 shows a plan view of a bus bar in which an electric current sensor is mounted on a shunt path that is divided at different positions.
Figure 15:
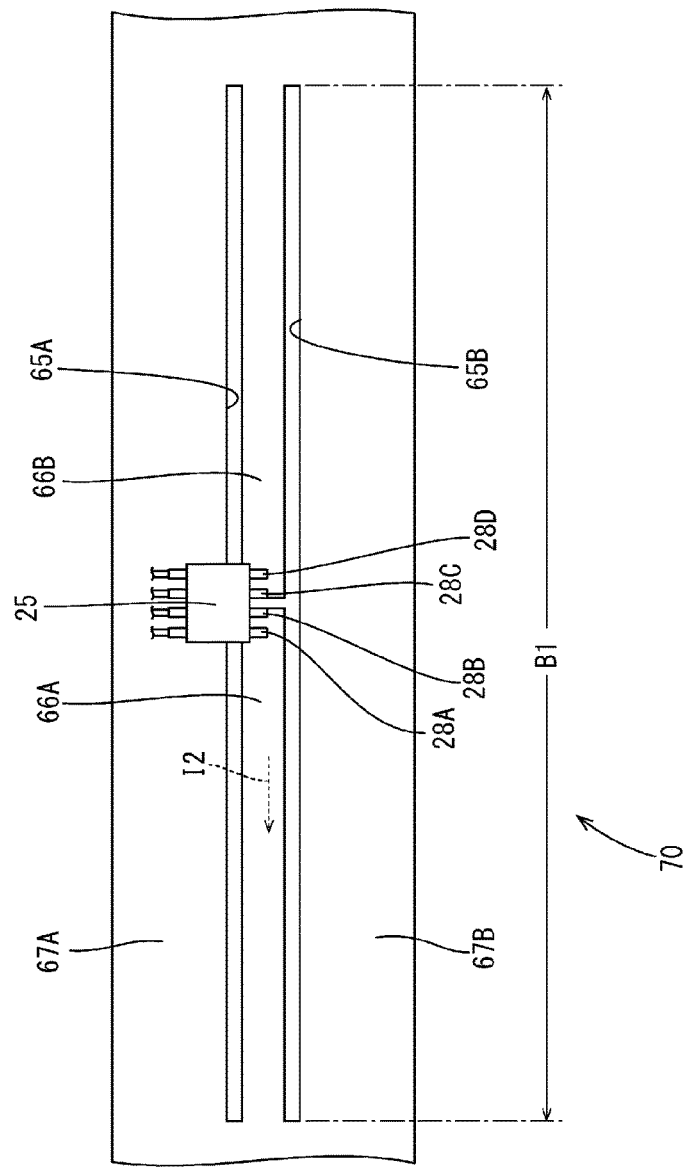
FIG. 15 shows a plan view of a bus bar in which an electric current sensor is mounted on shunt paths that are formed at different positions in its width direction.
Figure 16:
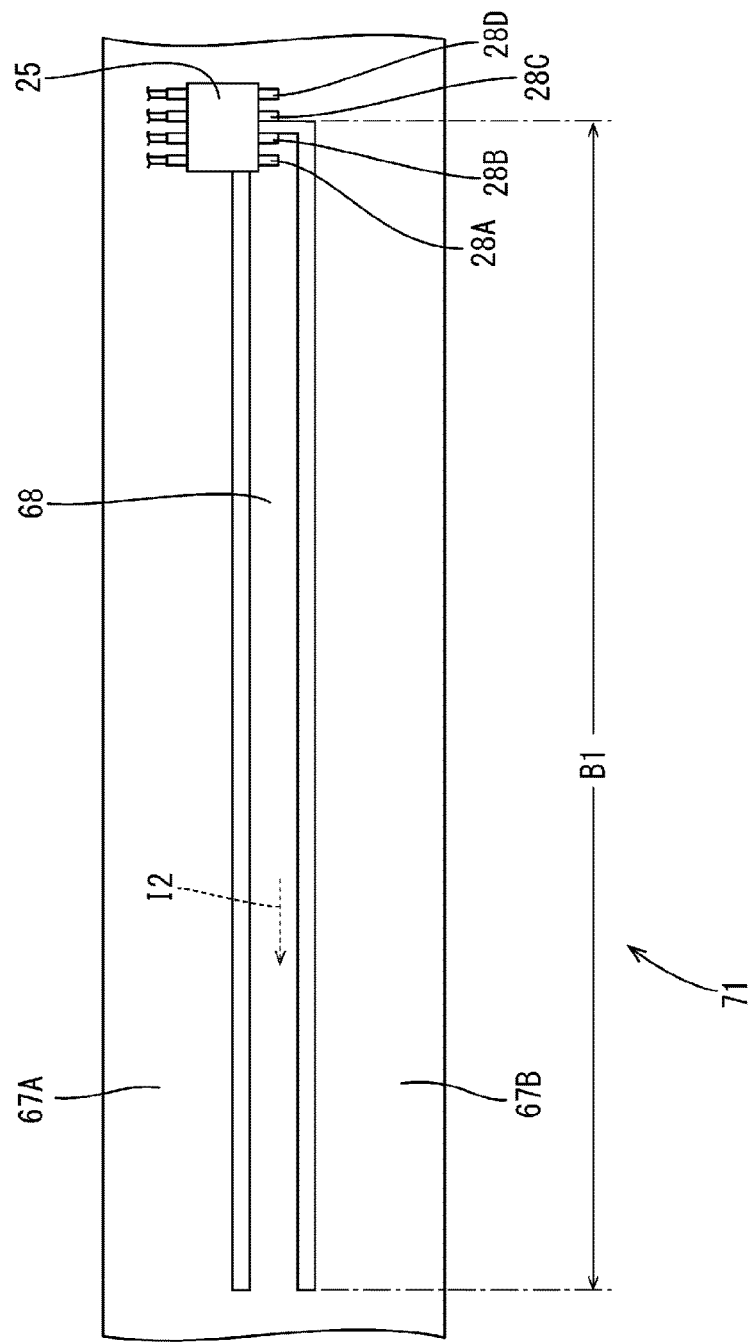
FIG. 16 shows a plan view of a bus bar in which an electric current sensor is mounted on a shunt path that is divided at different positions.

As shown in FIG. 14, as another embodiment, a bus bar 69 provided with shunt paths 64A and 64B that divide an end in the conduction direction of the section B1 not connected to any element having a resistance may also be adopted. As shown in FIG. 15, a configuration may also be adopted in which a middle portion in the width direction of a bus bar 70 is provided with two slits 65A and 65B extending in parallel to each other in the horizontal direction, shunt paths 66A and 66B are formed between the two slits 65A and 65B, and two main paths 67A and 67B are formed. Furthermore, in this case as well, as shown in FIG. 16, a bus bar 71 provided with a shunt path 68 that divides an end in the section B1 not connected to any element having a resistance may also be adopted.

Although the insulating board 13 is not depicted in FIGS. 13 to 16, a circuit board may also be configured by placing the insulating boards 13, 45, 46, 51, and 54 on the bus bars

60, 69, 70, and 71. Also, the bus bar 60 may be placed on the heat dissipation member 32.

According to the above-described embodiments, the electric current of the bus bar can be shunted with a simple configuration in which a plurality of electric current paths are formed by forming slits in the bus bar.

Other Embodiments

The present invention is not merely limited to the embodiments described above using the foregoing description and drawings, and embodiments such as the following are also encompassed in the technical scope of the present invention.

A Hall IC obtained by packaging a sensor and an IC for converting an output signal that is output from a Hall element to an output voltage may also be used as the electric current sensor 25. There is no limitation to a Hall-type electric current sensor, and any other type of electric current sensor may also be used. Another non-contact electric current sensor, or a contact electric current sensor, which is not a non-contact sensor, may also be used. Also, the number of power terminals 28A to 28D in the electric current sensor 25 is not limited to four. For example, the number of power terminals may also be two.

(2) Although the circuit board 12 includes the insulating board and the bus bar, the circuit board 12 may also include only one of the insulating board and the bus bar.

(3) Although the material of the conductive path of the insulating board, the bus bar, the terminals 28A to 28H in the electric current sensor, and the detection conductive paths 29 located between the terminals 28A to 28H is copper, there is no limitation to this. For example, aluminum or an aluminum alloy may also be used. Also, different materials may be used instead of the same material.

(4) The position at which the electrical junction box 10 is provided is not limited to an engine room of a vehicle, and the electrical junction box 10 may also be provided at other locations. Also, the electrical junction box may be provided on an object other than a vehicle.

(5) Although the electric current sensor detects a direct current, the electric current sensor may also detect an alternating current.

The invention claimed is:

1. A circuit assembly comprising:
    a circuit board having an insulating board and a bus bar mounted to the insulating board, the bus bar forming a conductive path; and
    an electric current sensor for detecting an electric current shunted from the bus bar, the electric current sensor having a portion electrically connected to a portion of the bus bar having no resistance other than a resistance of the portion of the bus bar and another portion of the electric current sensor electrically connected to the insulating board so as to place the bus bar in parallel with the insulating board.

2. The circuit assembly according to claim 1, wherein a material of a shunt path through which the shunt current flows has the same temperature properties as a material of a section of the insulating board.

3. The circuit assembly according to claim 1, wherein the insulating board and the bus bar are stacked on each other.

4. The circuit assembly according to claim 1, wherein the electric current sensor includes a plurality of power terminals and an output terminal for outputting a signal indicating a detection result of detecting an electric current.

5. The circuit assembly according to claim 4, wherein the plurality of power terminals are connected to the bus bar.

6. The circuit assembly according to claim 3, wherein in the bus bar, a plurality of electric current paths are formed in the section that is not connected to any electric component increasing the resistance of the plurality of electric current paths, and the electric current sensor is connected to the electric current paths.

7. The circuit assembly according to claim 1, wherein the section of the bus bar to which the electric sensor is attached is formed to detour.

8. An electrical junction box comprising:
    the circuit assembly according to claim 1; and
    a case for accommodating the circuit assembly.

* * * * *